(12) United States Patent
Fujino

(10) Patent No.: US 6,194,091 B1
(45) Date of Patent: Feb. 27, 2001

(54) MAGNETOSTATIC WAVE DEVICE

(75) Inventor: Masaru Fujino, Shiga-ken (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/160,908

(22) Filed: Sep. 25, 1998

(30) Foreign Application Priority Data

Sep. 29, 1997 (JP) .................................................. 9-263801

(51) Int. Cl.$^7$ ..................................................... G11B 5/66
(52) U.S. Cl. ............... 428/692; 428/694 T; 428/694 GT; 428/900; 252/62.51; 252/62.56; 252/62.57; 333/134; 333/147; 333/148; 333/150; 333/156; 333/193; 333/201; 359/280; 359/282; 385/1; 385/6; 385/130
(58) Field of Search .................................. 428/692, 694 T, 428/694 GT, 900; 252/62.51, 62.56, 62.57; 333/134, 147, 148, 150, 156, 193, 201; 359/280, 282; 385/1, 6, 130

(56) References Cited

U.S. PATENT DOCUMENTS

| | | | |
|---|---|---|---|
| 5,801,604 | * | 9/1998 | Fujino .................................. 333/202 |
| 5,871,856 | * | 2/1999 | Kumatoriya .......................... 428/200 |
| 5,985,472 | * | 11/1999 | Geho .................................... 428/692 |
| 6,016,088 | * | 1/2000 | Fijno .................................... 333/147 |
| 6,052,042 | * | 4/2000 | Kumotoriya .......................... 333/202 |
| 6,114,929 | * | 9/2000 | Kurata .................................. 333/202 |

FOREIGN PATENT DOCUMENTS 55-143009A * 1/1981 (JP).
09208393 * 12/1997 (JP).

OTHER PUBLICATIONS

Patent Abstracts of Japan; vol. 005, No. 015 (E–043); Jan. 29, 1981 & JP 55 143009 A (Matsushita Electric Ind. Co., Ltd.), Nov. 8, 1980, Abstract.
Patent Abstracts of Japan; vol. 097, No. 012, Dec. 25, 1997 & JP 09 208393 A (Shin Etsu Chem Co., Ltd.), Aug. 12, 1997, Abstract.

* cited by examiner

Primary Examiner—Leszek Kiliman
(74) Attorney, Agent, or Firm—Ostrolenk, Faber, Gerb & Soffen, LLP

(57) ABSTRACT

A magnetostatic wave device comprises a magnetic garnet single crystal film. The single crystal film magnetic garnet is represented by the general formula of $Y_3Fe_{5-x-y}In_xM_yO_{12}$ (wherein M is at least one of Ga, Al and Sc, $0.01 \leq x \leq 0.45$ and $0 \leq y \leq 1.2$) and the Curie temperature is about 150° C. to 285° C.

12 Claims, 1 Drawing Sheet

MAGNETOSTATIC WAVE DEVICE

BACKGROUND OF THE INVENTION

1. Field of the Invention

The present invention relates to a magnetostatic wave device, and more particularly to a magnetostatic wave device comprising a magnetic garnet single crystal film.

2. Description of the Related Art

Single crystals of $Y_3Fe_5O_{12}$ (referred to YIG hereinafter), a kind of magnetic garnet single crystal film, has been an important substance as a material for use in magnetostatic wave devices. A remarkable property of YIG is that it has an extremely small ferromagnetic half-width ($\Delta H$), which is related to the fact that the difference between input signals and output signals can be made small when it is used for the magnetostatic wave device. An additional feature is that a YIG is characterized by a saturation phenomenon at a relatively small input signal level. The YIG single crystal films have been widely used for magnetostatic wave devices such as limiters and noise filters by taking advantage of this phenomenon. Various kind of single crystal films of magnetic garnet containing iron have been also used for the magnetostatic wave device in addition to the YIG single crystal film described above.

However, the feature of the YIG output signal being saturated at a relatively small input signal level is not revealed immediately after receiving the input signal. Instead, the input signal is directly output as an output signal. There is therefore a transient response phenomenon in that the output signal is saturated as a function of a time lapse which causes a problem in that the function as a magnetostatic wave device can not be fully displayed. Although increasing the insertion loss of the magnetostatic wave device is one solution for this problem, too large an insertion loss makes the output signal level too small.

SUMMARY OF THE INVENTION

Accordingly, the object of the present invention is to provide a magnetostatic wave device with improved performance by shortening the time interval suffering the transient response phenomenon without increasing the insertion loss.

For attaining the foregoing object, the present invention provides a magnetostatic wave device which comprises a magnetic garnet single crystal film, and the magnetic garnet single crystal film is represented by the general formula of $Y_3Fe_{5-x-y}In_xM_yO_{12}$ (wherein M is at least one of Ga, Al and Sc, $0.01 \leq x \leq 0.45$ and $0 \leq y \leq 1.2$) and the Curie temperature of the magnetic garnet single crystal film is about 150° C. to 285° C.

According to the present invention, a magnetostatic wave device can be obtained in which the time interval suffering the transient response phenomenon is shortened less than 120 ns without increasing the insertion loss.

For the purpose of illustrating the invention, there is shown in the drawing a form presently preferred, it being understood, however, that the invention is not limited to the precise arrangements and instrumentalities shown.

DETAILED DESCRIPTION OF PREFERRED EMBODIMENTS

Figure 1:
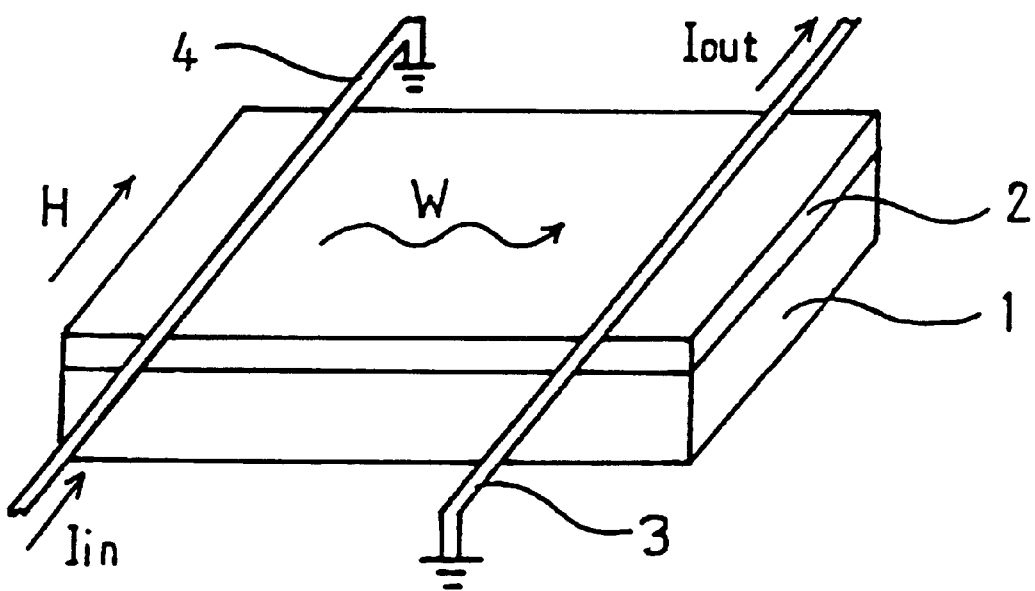
FIG. 1 is a perspective view showing one example of the magnetostatic wave device.

Hereinafter, the preferred embodiments of the present invention are explained in detail with reference to the drawings.

EXAMPLE 1

Firstly, $Fe_2O_3$, $Y_2O_3$, $Lu_2O_3$, $Ga_2O_3$, $Al_2O_3$, $Sc_2O_3$ and $In_2O_3$ as raw material for magnetic garnet films and PbO and $B_2O_3$ as solvents were prepared. A $Gd_3Ga_5O_{12}$ substrate as a substrate for forming a magnetic garnet film by a liquid phase epitaxial growth method was also prepared.

The materials described above were selected and weighed so as to obtain a magnetic garnet film having the composition shown in TABLE 1, followed by adding PbO and $B_2O_3$ as solvents and filling the mixture into a platinum crucible placed in a vertical type electric furnace. The mixture was then heated at about 1200° C. to form a uniform molten liquid.

After keeping the molten liquid at a constant temperature of around 900° C. to bring the liquid into a super-saturation state, the $Gd_3Ga_5O_{12}$ substrate was immersed into this molten liquid in the next step to allow the garnet film to grow for a given time interval by rotating the substrate. Then, the substrate was pulled from the molten liquid and the adhered molten liquid on the garnet film was scattered off by centrifugal force by allowing the substrate to rotate at high speed, thereby obtaining a magnetic garnet single crystal film formed on the substrate.

TABLE 1

| Sample No. | Composition | Insertion loss (dB) | Transient response time (ns) | Saturation magnetization (G) | Curie temperature (° C.) | Lattice constant (nm) |
|---|---|---|---|---|---|---|
| *1 | $Y_3Fe_5O_{12}$ | 7 | 184 | 1760 | 287 | 1.2376 |
| 2 | $Y_3Fe_{4.99}In_{0.01}O_{12}$ | 7 | 120 | 1780 | 285 | 1.2380 |
| 3 | $Y_3Fe_{4.3}In_{0.1}Ga_{0.6}O_{12}$ | 8 | 112 | 1160 | 252 | 1.2387 |
| 4 | $Y_3Fe_{3.7}In_{0.1}Sc_{0.1}Ga_{1.1}O_{12}$ | 9 | 118 | 190 | 245 | 1.2383 |
| *5 | $Y_3Fe_{3.6}In_{0.1}Sc_{0.15}Ga_{1.15}O_{12}$ | 12 | 114 | 180 | 242 | 1.2387 |
| 6 | $Y_3Fe_{4.7}Al_{0.1}In_{0.2}O_{12}$ | 8 | 119 | 2080 | 219 | 1.2374 |
| *7 | $Y_{2.9}Lu_{0.1}Fe_{4.8}In_{0.2}O_{12}$ | 13 | 118 | 2100 | 221 | 1.2376 |
| 8 | $Y_3Fe_{4.32}In_{0.45}Al_{0.23}O_{12}$ | 9 | 113 | 2380 | 150 | 1.2381 |
| *9 | $Y_3Fe_{4.31}In_{0.46}Al_{0.23}O_{12}$ | 12 | 110 | 2400 | 138 | 1.2384 |
| *10 | $Y_3Fe_{4.45}In_{0.35}Ga_{1.2}O_{12}$ | 12 | 115 | 240 | 145 | 1.2379 |

Electrodes 3, 4 were then formed on the magnetic garnet single crystal film 2 as shown in FIG. 1 to produce a magnetostatic wave device and the insertion los and transient response time were measured. The reference numeral 1 denotes the $Gd_3Ga_5O_{12}$ substrate while H represents the applied direction of external magnetic field, $I_{in}$ represents the input direction of a microwave, W represents the propagation direction of a magnetostatic surface wave (MSSW) and $I_{out}$ represents the output direction of the microwave.

The saturation magnetization was measured using a sample vibration type magnetometer and the Curie temperature was determined by measuring the temperature dependence of the saturation magnetization. Lattice constants were also measured by a X-ray analysis.

The results obtained from the experiments above are listed in TABLE 1. Samples with a mark (*) are outside of the scope of the present invention and the others are within the scope of the present invention.

EXAMPLE 2

Firstly, $Fe_2O_3$, $Y_2O_3$, $La_2O_3$, $Ga_2O_3$, and $In_2O_3$ as raw materials for magnetic garnet films, and PbO and $B_2O_3$ as solvents were prepared. Then, a $Sm_3Ga_5O_{12}$ substrate as a substrate for forming a magnetic garnet film by a liquid phase epitaxial growth method was prepared.

The materials described above were selected and weighed so as to obtain a magnetic garnet film having the composition shown in TABLE 2, followed by adding PbO and $B_2O_3$ as solvents and filling the mixture into a platinum crucible placed in a vertical type electric furnace. Then, the mixture was heated at about 1200° C. to form a uniform molten liquid.

After keeping the molten liquid at a constant temperature of around 900° C. to bring the liquid into a super-saturation state, the $Sm_3Ga_5O_{12}$ substrate was immersed into this molten liquid in the next step to allow the garnet film to grow for a given time interval by rotating the substrate. Then, the substrate was pulled up from the molten liquid and the adhered molten liquid on the garnet film was scatter off by centrifugal force as a result of allowing the substrate to rotate at high speed, thereby obtaining a single crystal film of magnetic garnet formed on the substrate.

EXAMPLE 3

Firstly, $Fe_2O_3$, $Y_2O_3$, $La_2O_3$, $In_2O_3$ and $Sc_2O_3$ as raw materials for magnetic garnet films, and PbO and $B_2O_3$ as solvents were prepared. Then, a $Nd_3Ga_5O_{12}$ substrate as a substrate for forming a magnetic garnet film by a liquid phase epitaxial growth method was prepared.

The materials described above were selected and weighed so as to obtain a magnetic garnet film having the composition shown in TABLE 3, adding PbO and $B_2O_3$ as solvents and filling the mixture into a platinum crucible placed in a vertical type electric furnace. Then, the mixture was heated at about 1200° C. to form a uniform molten liquid.

After keeping the molten liquid at a constant temperature of around 900° C. to bring the liquid into a super-saturation state, the $Nd_3Ga_5O_{12}$ substrate was immersed into this molten liquid in the next step to allow the garnet film to grow for a given time interval by rotating the substrate. Then, the substrate was pulled from the molten liquid and the adhered molten liquid on the garnet film was scatter off by centrifugal force by allowing the substrate to rotate at high speed, thereby obtaining a single crystal film of magnetic garnet formed on the substrate.

TABLE 2

| Sample No. | Composition | Insertion loss (dB) | Transient response time (ns) | Saturation magnetization (G) | Curie temperature (° C.) | Lattice constant (nm) |
| --- | --- | --- | --- | --- | --- | --- |
| 11 | $Y_3Fe_{4.45}In_{0.4}Ga_{0.05}O_{12}$ | 9 | 116 | 2550 | 167 | 1.2438 |
| *12 | $Y_{2.9}La_{0.1}Fe_{4.5}In_{0.45}Ga_{0.05}O_{12}$ | 18 | 109 | 2500 | 151 | 1.2439 |

Then, the magnetostatic wave device was produced by the same method as in Example 1 and the insertion loss and transient response time were measured. The saturation magnetization was also measured using a sample vibration type magnetometer as well as the Curie temperature from the measurement of temperature dependence of the saturation magnetization. Lattice constants were determined by a X-ray analysis.

The results obtained from the experiments above are listed in TABLE 2. Sample 12 is outside of the scope of the present invention and sample 11 within the scope of the present invention.

TABLE 3

| Sample No. | Composition | Insertion loss (dB) | Transient response time (ns) | Saturation magnetization (G) | Curie temperature (° C.) | Lattice constant (nm) |
| --- | --- | --- | --- | --- | --- | --- |
| 13 | $Y_3Fe_{4.2}In_{0.4}Sc_{0.4}O_{12}$ | 9 | 109 | 2980 | 163 | 1.2506 |
| *14 | $Y_{2.9}La_{0.1}Fe_{4.3}In_{0.4}Sc_{0.3}O_{12}$ | 21 | 108 | 2830 | 167 | 1.2509 |

Then, the magnetostatic wave device was produced by the same method as in Example 1 and the insertion loss and transient response time were measured. The saturation magnetization was also measured using a sample vibration type magnetometer as well as the Curie temperature from the measurement of temperature dependence of the saturation magnetization. Lattice constants were determined by a X-ray analysis.

The results obtained from the experiments above are listed in TABLE 3. Sample 14 is outside of the scope of the present invention and sample 13 is within the scope of the present invention.

As are evident from the results in Examples 1 to 3, the magnetostatic wave device comprises a magnetic garnet single crystal film having a composition within the scope of the present invention and whose Curie temperature is limited enables one to obtain high performance characteristics in which the time interval suffering the transient response phenomenon is shortened without increasing the insertion loss.

A good magnetostatic wave device can not be obtained, on the contrary, when the Curie temperature is higher than about 285° C. as in the sample number 1 or when the Curie temperature is lower than about 150° C. as seen in the sample number 10, because the transient response time becomes long after forming into a magnetostatic wave device in the former case and the insertion loss becomes large in the latter case. When the content of M (at least one of Ga, Al and Sc) is larger than 1.2 as in the sample number 5, on the other hand, the insertion loss becomes large after forming into a magnetostatic wave device, failing to obtain a good magnetostatic wave device.

Although the single crystal film of magnetic garnet in which a part of Y is substituted, as in the sample numbers 7, 12 and 14, has a Curie temperature within the range of 150° C. to 285° C., it is not preferable since the insertion loss becomes large after forming into a magnetostatic wave device.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A magnetostatic wave device comprising a magnetic garnet single crystal film of the formula $Y_3Fe_{5-x-y}In_xM_yO_{12}$ in which M is at least one element selected from the group consisting of Ga, Al and Sc, $0.01 \leq x \leq 0.45$ and $0 \leq y \leq 1.2$ and the Curie temperature is about 150° C. to 285° C.

2. The magnetostatic wave device of claim 1 wherein $0 < y \leq 1.2$ and M is Ga.

3. The magnetostatic wave device of claim 1 wherein $0 < y \leq 1.2$ and M is Al.

4. The magnetostatic wave device of claim 1 wherein $0 < y \leq 1.2$ and M is Sc.

5. The magnetostatic wave device of claim 1 wherein $0 < y \leq 1.2$ and M is two members of said group.

6. The magnetostatic wave device of claim 1 wherein the Curie temperature is 167 to 252° C.

7. A magnetostatic wave device comprising a substrate in combination with a magnetic garnet single crystal film of the formula $Y_3Fe_{5-x-y}In_xM_yO_{12}$ in which M is at least one element selected from the group consisting of Ga, Al and Sc, $0.01 \leq x \leq 0.45$ and $0 \leq y \leq 1.2$ and the Curie temperature is about 150° C. to 285° C.

8. The magnetostatic wave device of claim 7 wherein $0 < y \leq 1.2$ and M is Ga.

9. The magnetostatic wave device of claim 7 wherein $0 < y \leq 1.2$ and M is Al.

10. The magnetostatic wave device of claim 7 wherein $0 < y \leq 1.2$ and M is Sc.

11. The magnetostatic wave device of claim 7 wherein $0 < y \leq 1.2$ and M is two members of said group.

12. The magnetostatic wave device of claim 7 wherein the Curie temperature is 167 to 252° C.

* * * * *